(12) United States Patent
Monsef et al.

(10) Patent No.: US 7,092,254 B1
(45) Date of Patent: Aug. 15, 2006

(54) COOLING SYSTEM FOR ELECTRONIC DEVICES UTILIZING FLUID FLOW AND AGITATION

(75) Inventors: Eric Monsef, Los Gatos, CA (US); Christiaan Ligtenberg, San Carlos, CA (US); Zach Zeliff, San Jose, CA (US); Ihab A. Ali, San Jose, CA (US)

(73) Assignee: Apple Computer, Inc., Cupertino, CA (US)

( * ) Notice: Subject to any disclaimer, the term of this patent is extended or adjusted under 35 U.S.C. 154(b) by 110 days.

(21) Appl. No.: 10/913,255

(22) Filed: Aug. 6, 2004

(51) Int. Cl.
*H05K 7/20* (2006.01)

(52) U.S. Cl. ............... 361/699; 257/714; 174/15.1; 165/80.4

(58) Field of Classification Search ............ 361/699; 174/15.1; 165/80.4; 257/714
See application file for complete search history.

(56) References Cited

U.S. PATENT DOCUMENTS

| | | | |
|---|---|---|---|
| 5,270,572 A | | 12/1993 | Nakajima et al. |
| 5,309,318 A | | 5/1994 | Beilstein et al. |
| 6,123,145 A | * | 9/2000 | Glezer et al. ......... 165/104.33 |
| 6,611,425 B1 | * | 8/2003 | Ohashi et al. ............. 361/687 |
| 6,650,542 B1 | * | 11/2003 | Chrysler et al. ........... 361/699 |
| 6,801,430 B1 | * | 10/2004 | Pokharna .................. 361/695 |
| 6,937,472 B1 | * | 8/2005 | Pokharna .................. 361/700 |
| 6,952,346 B1 | * | 10/2005 | Tilton et al. ............... 361/699 |
| 6,955,063 B1 | * | 10/2005 | Adiga et al. .............. 62/259.2 |
| 6,995,980 B1 | * | 2/2006 | Tustaniwskyj et al. ..... 361/699 |

* cited by examiner

*Primary Examiner*—Boris Chervinsky

(74) *Attorney, Agent, or Firm*—Blakely, Sokoloff, Taylor & Zafman LLP

(57) ABSTRACT

A cooling system, the system comprises a housing having an inlet and an outlet, a liquid to be flown from the inlet into the housing and out of outlet to exit the housing. The housing further has an interior portion for an electronic device to reside therein and a vibration transducer coupling to the housing. The liquid is flown across the electronic device to dissipate heat from the electronic device. The vibration transducer causes turbulent or agitation in the liquid as the liquid is flown across the electronic device.

69 Claims, 4 Drawing Sheets

COOLING SYSTEM FOR ELECTRONIC DEVICES UTILIZING FLUID FLOW AND AGITATION

BACKGROUND

Aspects of the present invention pertain to a cooling system and a method for cooling electronic devices such as a hard drive, an optical device, a battery, a central processing unit (CPU) or other integrated circuit device of a computer and more particularly, of a laptop/notebook computer.

Advances continue to be made in the manufacture of solid-state electronic devices, resulting in increasing functionality, density, and performance of the integrated circuits (ICs). The amount of heat generated, and accordingly the amount of power needed to be dissipated, by modern integrated circuits generally increases with increases in the density and speed of the circuits. Removal of heat produced by the integrated circuits therefore continues to be of a significant concern in modern integrated circuit package and system designers. For instance, a loss of performance and the degradation in reliability of integrated circuits may occur and often does when the circuits operate at elevated temperatures.

In addition, the trend toward more compact electronic systems is also continuing, thus exacerbating the thermal problem produced by the high-complexity and high-performance integrated circuits. For example, laptop or notebook sized computers have recently become quite popular, with continuing market pressure toward even smaller computer systems such as personal digital assistants (PDA). However, these small computer systems eliminate many of the traditional techniques for heat removal available for large-scale computer systems, such as the use of fans for convection cooling of the integrated circuits.

Many methods and apparatuses have been developed to remove heat from heat generating components located within the confines of a computer system enclosure. Many methods employ a fluid flow model to dissipate heat generated from the components such as immersing the components in a pool of inert dielectric liquid, using thermosyphons where a liquid evaporates with applied heat and condenses dissipating that heat elsewhere in a closed system, and using heat pipes where the liquid evaporates, condenses at another region and reaches the hot area through wick structures that line the heat pipes.

FIG. 1 illustrates a direct liquid cooling system. An electronic device that generates heat such as a central processing unit (CPU) 102 is cooled by a direct liquid cooling device 100. The CPU 102 is coupled to a substrate 104 which is typically placed on a printed circuit board (PCB) 104. Methods to attach the CPU 102 to the substrate 104 and to the PCB 106 are well known in the art. A manifold 108 is placed over the CPU 102. The manifold 108 includes a liquid inlet 110 and liquid outlets 112A and 112B. Gaskets 114 may be included to attach or place the manifold 108 over the CPU 102. The gaskets 114 also function to seal the manifold 108 over the CPU 102 to prevent liquid from leaking out of the device 100. In the cooling device 100, liquid is injected and dispensed or flown over the CPU 102 via the inlet 110. Liquid is flown out of the manifold 108 via the outlets 112A and 112B taking the heat transferred from the CPU 102 to outside of the system. The liquid is typically recycled back into the cooling device 100 via a pump action.

FIG. 2 illustrates another cooling device 200 which is similar to the device 100 with the addition of a plate 116 having a plurality of orifices 118 to increase the surface area that the liquid can contact the CPU 102. The plate 116 can be placed below the liquid inlet 110. Liquid passing through the inlet 110 is distributed over the plate 116 and dispensed over the CPU 102 via the orifices 118. The liquid thus can contact a wider area of the CPU 102 more uniformly. A pump is typically used to cause the liquid to jet through the orifices 118, hence, the cooling device 200 is often termed a jet impingement cooling device.

FIG. 3 illustrates an example of a cooling device 300. The device 300 employs a cross flow configuration to flow liquid across an electronic device. As shown in FIG. 3, an electronic device (e.g., a CPU 102) is placed on a substrate 104 which is typically placed on a PCB 106. A manifold 120 is placed over the CPU 102 using gaskets 114 to couple and seal the manifold 120 over the CPU 102. A liquid inlet 122 and a liquid outlet 124 are included in the manifold 120. Liquid is flown across the CPU 102 and out of the outlet 124. The liquid travel path can be configured to be recycled so that the liquid is recycled for the cooling device 300.

The cooling devices described have several disadvantages. Devices similar to the cooling devices 100 and 200 tend to be too large and thus not practical for small electronic devices where spaces are limited and electronic devices need to be cooled are typically placed in small confines of a slim/small design (e.g., laptop or notebook computer). Devices similar to the cooling devices 100 and 200 use a jetting device to accelerate the liquid over the CPU 102 and that may exert too much pressure on the CPU 102. Devices similar to the device 300, on the other hand, can be small but do not have the liquid flowing fast enough to increase efficiency of the cooling devices. Additionally, the liquid tends to stay stagnant above the CPU thus heat generated by the CPU is not transferred or removed quick enough

SUMMARY

In accordance to embodiments of the present invention, a cooling device or system for an electronic device is provided. The cooling device utilizes a fluid flow cooling device in combination with a vibration transducer to agitate or causes turbulent in the fluid as it is flown across the electronic device. In one aspect, the vibration transducer can be a piezoelectric transducer or other ultrasonic transducer that can cause a vibration at a non-audible frequency range to the liquid. In one aspect, the cooling device employs a cross flow cooling model to flow the liquid across the electronic device.

One aspect of the invention pertains to a cooling system that comprises a housing having an inlet and an outlet. A liquid is flown from the inlet into the housing and out of outlet to exit the housing to cause heat to transfer from an electronic device to the liquid. The housing further has an interior portion for the electronic device to reside therein. The housing also includes a vibration transducer coupled thereto. The liquid is flown across the electronic device to dissipate heat from the electronic device. The vibration transducer causes turbulent or agitation in the liquid as the liquid is flown across the electronic device.

One aspect of the invention pertains to a semiconductor device with a cooling system that comprises an integrated circuit bonded to a substrate, a housing coupled over the integrated circuit, an inlet provided in the housing, an outlet provided in the housing, and a vibration transducer coupled to the housing and placed above the integrated circuit. A liquid is flown across the integrated circuit from the inlet and exit through the outlet to cool the integrated circuit.

One aspect of the invention pertains to a computer system with a cooling device which comprises an electronic device disposed within an enclosure case, and a cooling device placed over a surface of the electronic device of the computer system. The cooling device further comprises a housing having an inlet and an outlet, a liquid to be flown from the inlet into the housing and out of outlet to exit the housing, the housing further having an interior portion for an electronic device to reside therein, and a vibration transducer coupled to the housing. The liquid is flown across the electronic device to dissipate heat from the electronic device and wherein the vibration transducer causes turbulent or agitation in the liquid as the liquid is flown across the electronic device. The electronic device can be any one of an integrated circuit, a semiconductor device, a central processing unit, a controller, a graphic controller, a memory chip, a display element, a hard disk drive, a battery, a printer circuit board, an optical disk drive, and other internal components of the computer system.

Another aspect of the invention pertains to a method to dissipate heat from an electronic device that comprises placing a cooling device over the electronic device, flowing a liquid into the cooling device and over the top surface of the electronic device, and agitating the liquid while the liquid is flowing across the electronic device. The liquid agitation prevents stagnation of the liquid over the electronic device. The cooling device is a cross flow cooling device in one embodiment. The vibration transducer is a piezoelectric transducer in one embodiment.

BRIEF DESCRIPTION OF DRAWINGS

Embodiments of the present invention will be understood more fully from the detailed description given below and from the accompanying drawings of various embodiments of the invention, which, however, should not be taken to limit the invention to the specific embodiments, but are for explanation and understanding only. In the drawings.

DETAILED DESCRIPTION

Exemplary embodiments are described with reference to specific configurations and techniques pertaining to an apparatus and method for removing heat from a heat generating component located within an electronic or computer system enclosure is described. In the following description, numerous specific details are set forth such as material types, dimensions, processing steps, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention. In order to illustrate the need for cooling systems that are capable of being integrated within an enclosure especially one having limited available space, this discussion will mainly be limited to those needs associated with removing heat from integrated circuits housed within portable computers, such as notebook and laptop computers. It will be recognized, however, that such focus is for descriptive purposes only and that the apparatus and methods of the present invention are applicable to other thin profile or small form factor electronic devices. Those of ordinary skill in the art will appreciate the various changes and modifications to be made while remaining within the scope of the appended claims. Additionally, well known elements, devices, components, circuits, process steps and the like are not set forth in detail.

Embodiments of the present invention pertain to a cooling device or system for an electronic device. The cooling device utilizes a fluid flow cooling device in combination with a vibration transducer to agitate or causes turbulent in the fluid as it is flown across the electronic device. In one aspect, the vibration transducer can be a piezoelectric transducer or other ultrasonic transducer that can cause vibration at a non-audible frequency range. The non-audible frequency range will allow the cooling device to be substantially noiseless which is a desirable feature in electronic devices such as a laptop computer. In one aspect, the cooling device employs a cross flow cooling model to flow liquid across the electronic device. The cooling device can be used for cooling electronic devices such as a hard drive, an optical device, a battery, a central processing unit (CPU), a memory chip, or other integrated circuit devices of an electronic device, a computer system and more particularly, of a laptop or notebook computer.

Figure 1:
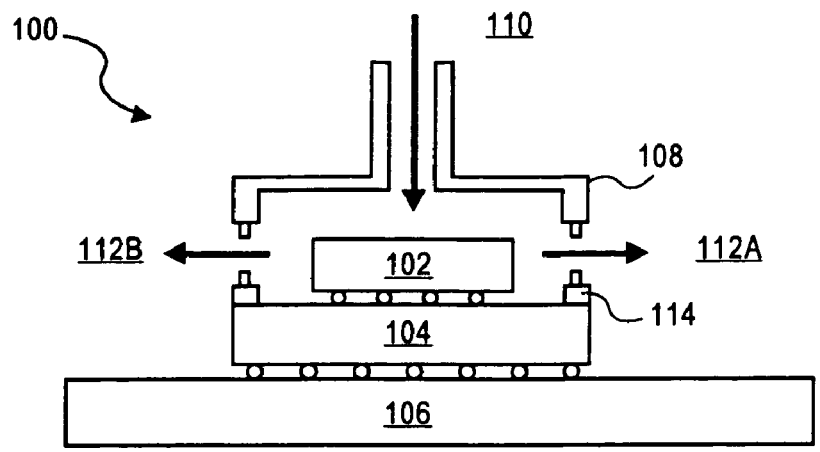
FIG. 1 illustrates an exemplary direct liquid cooling system used for cooling an electronic device that generates heat.
Figure 2:
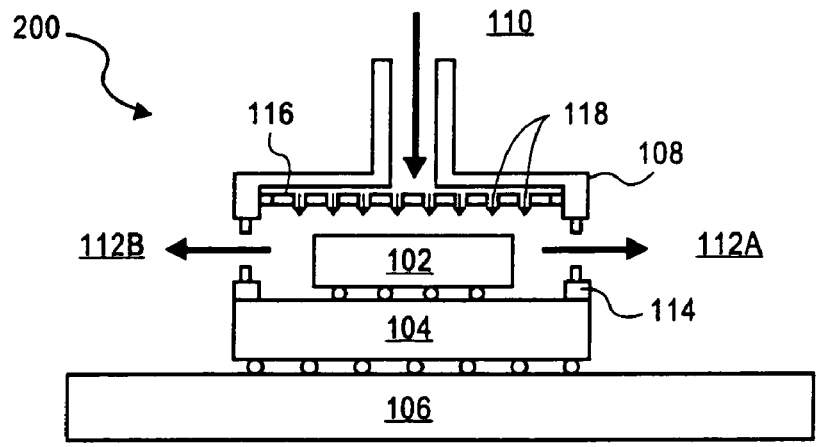
FIG. 2 illustrates an exemplary direct liquid cooling system used for cooling an electronic device that generates heat which employs a jet impingement to increase the flow of liquid.
Figure 3:
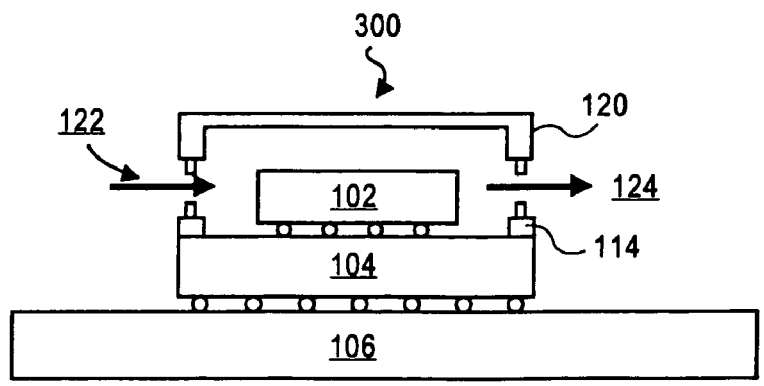
FIG. 3 illustrates an exemplary cross flow cooling system for cooling an electronic device that generates heat.
Figure 4:
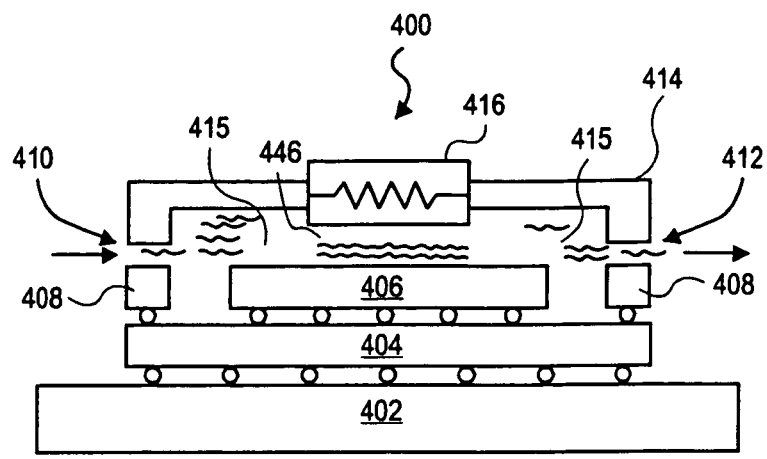
FIG. 4 illustrates an exemplary cooling system in accordance to exemplary embodiments of the present invention.

FIG. 4 illustrates an example of a cooling device or system 400 that can be used for an electronic device 406. The device 400 employs a liquid flow configuration to flow liquid across an electronic device and an agitation device to cause turbulent in the liquid as it flows across the electronic device 406. As shown in FIG. 4, the cooling device 400 includes a housing 414 having an inlet 410 and an outlet 412. A vibration transducer 416 is coupled to the housing 414.

As shown in the figure, a coolant liquid is flown into the housing 414 from the inlet 410 and exit the housing 414 via the outlet 412. The housing 414 includes an interior portion 415 where the electronic device 406 can reside. In one embodiment, the housing 414 is made of a rigid material such as plastic, ceramic, or other insulating or non-conductive rigid material. In one embodiment, the vibration transducer 416 is placed on the top surface area of the housing 414. The housing 414 can be configured to have an opening created for the vibration transducer 416 to be placed therethrough. The housing 414 is placed over the electronic device 406 and is sealed over the electronic device 406 to prevent leakages from the housing 414 into surrounding area.

Coolant liquid is flown across the electronic device 406 to dissipate heat generated by the electronic device 406. As the coolant liquid is flown across the electronic device 406, the vibration transducer 416 is turned on to cause a turbulent or agitation 446 in the liquid flow system. The vibration transducer 415 prevents stagnation of the coolant liquid over the area above, especially immediately above the electronic device 406. Often, in a conventional cross flow cooling system, as liquid is flown across the electronic device, the liquid immediately above the electronic device is stagnant and has very low movement, or substantially no movement. Heat is thus not efficiently transferred since new liquid is not replacing the heated liquid fast enough. In the embodiments of the present invention, with the addition of the vibration transducer 416, the liquid that is flown across the electronic device 406 is agitated or vibrated such that there is no or substantially no stagnation in the liquid flow. Heat can thus be transferred more efficiently without the need to increase the flow rate of the liquid or the amount of the liquid into the cooling device 400. Since agitation is applied to the liquid, only a thin layer of the liquid is needed to be flown over the electronic device 406 at any one point to cool the electronic device 406. Additionally, the cooling device 400 can be made much smaller than a device similar to the device 100 or 200 illustrated above. Additionally, only a small space is required for the fluid path across the electronic device 400 since the vibration transducer 416 will agitate the liquid resulting in much faster heat exchange.

Continuing with FIG. 4, the cooling device 400, in one embodiment, the electronic device 406 is an integrated circuit. The electronic device 406 can be various type of semiconductor device that generates heat. The electronic device 406 can be a CPU, a graphic controller card, a memory card, a display element, a hard drive, a printed circuit board, and an optical disk drive. The cooling device 400 needs not encapsulate the entire electronic device 406 and can be placed over a portion of the electronic device 406 that needs heat dissipation. The cooling device 400 thus can be adapted for hot spot cooling of the electronic device 406.

In one embodiment, the electronic device 406 is placed on a substrate 404 which may be placed on a printed circuit board 402 or other component of a computer system. Soldering balls or other adhering features can be used to couple the electronic device 406 to the substrate 404 and the printed circuit board 402 as is known in the art. In one embodiment, the housing 414 is a manifold placed over the electronic device 406 using gaskets 408 to couple and seal the housing 414 over the electronic device 406 or a particular region of the electronic device 406.

In one embodiment, the vibration transducer 416 is positioned above the electronic device 406 at a predetermined distance. The vibration transducer 416 can be positioned so that there is a distance between about 1 mm to about 30 mm between the electronic device 406 and the vibration transducer 416. The vibration transducer 416 can also be configured to direct vibration or agitation over a particular region of the electronic device 406. The vibration transducer 416 is a piezoelectric transducer, in one embodiment. The vibration transducer 416 causes a vibration in a non-audible range so that the cooling system 400 can operate essentially in a noiseless fashion. The vibration transducer 416 also causes vibration in an ultrasonic range so that it is substantially non-audible. The vibration transducer 416 can also operates at high frequency for optimal vibration or agitation movement.

Figure 5:
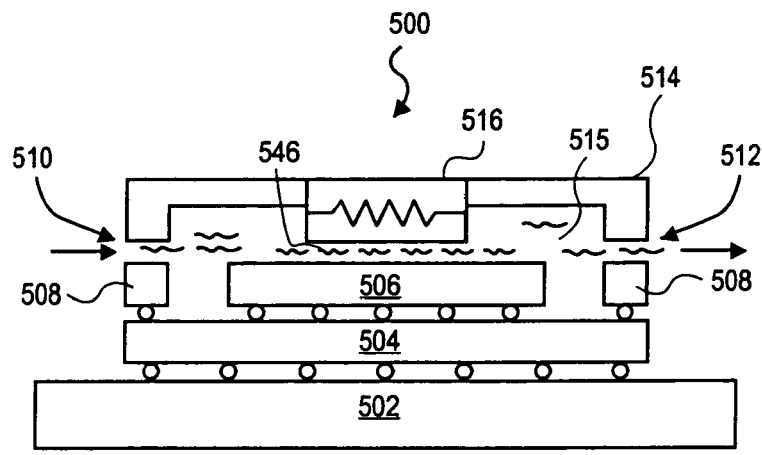
FIG. 5 illustrates another exemplary cooling system in accordance to exemplary embodiments of the present invention.

FIG. 5 illustrates another exemplary embodiment of a cooling device 500. The cooling device 500 is similar to the cooling device 400 with the exception that the vibration transducer is placed as close as possible over the electronic device. The device 500 employs a liquid flow configuration to flow liquid across an electronic device 506 and an agitation device to cause turbulent in the liquid as it flows across the electronic device 506 similar to the device 400. As shown in FIG. 5, the cooling device 500 includes a housing 514 having an inlet 510 and an outlet 512. A vibration transducer 516 is coupled to the housing 514. The vibration transducer 516 is placed almost immediately above the electronic device 506. In one embodiment, the vibration transducer 516 is placed such that there is a thin liquid path or a small distance between the transducer 516 and the electronic device 506 for the liquid to flow therethrough. A thin layer of coolant liquid is flown into the housing 514 from the inlet 510 and exit the housing 514 via the outlet 512. The housing 514 includes an interior portion 515 where the electronic device 506 can reside. In one embodiment, the housing 514 is made of a rigid material such as plastic, ceramic, or other insulated rigid material. In one embodiment, the vibration transducer 516 is placed on the top surface area of the housing 514. The housing 514 can be configured to have an opening created for the vibration transducer 516 to be placed therethrough. The housing 514 is placed over the electronic device 506 and is sealed over the electronic device 506 to prevent leakages from the housing 514 into surrounding area using gaskets 508 in one embodiment. Coolant liquid is flown across the electronic device 506 to dissipate heat generated by the electronic device 506. As the coolant liquid is flown across the electronic device 506, the vibration transducer 516 is turned on to cause a turbulent or agitation 546 in the liquid flow system. The electronic device 506 is also placed on a substrate 504 which may be placed on a printed circuit board 502 or other component of a computer system. In one embodiment, the housing 514 is a manifold placed over the electronic device 506 using gaskets 508 to couple and seal the housing 514 over the electronic device 506 or a particular region of the electronic device 506.

Figure 6:
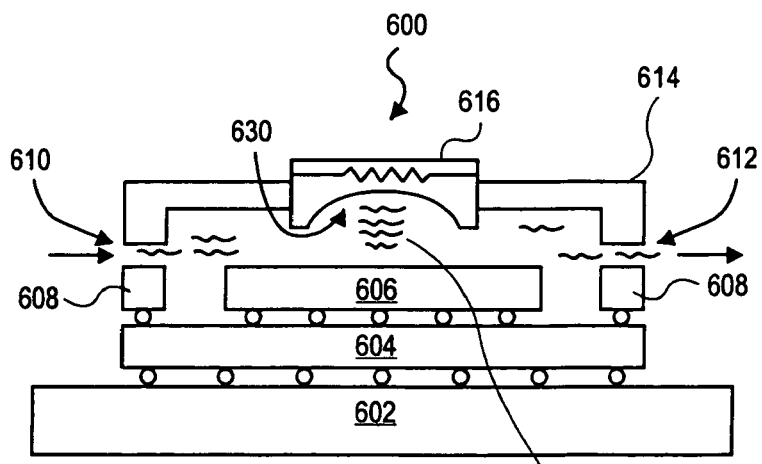
FIG. 6 illustrates another exemplary cooling system in accordance to exemplary embodiments of the present invention.

The energy from the vibration transducer of a cooling system can be directed geometrically or the vibration transducer can be physically moved or placed to provide agitation to the area of the electronic device that needs the most cooling. FIG. 6 illustrates an exemplary embodiment of such placement. In the present embodiment, the vibration transducer is configured so that it can direct vibration or agitation to the location 646 above the electronic device.

FIG. 6 illustrates an exemplary embodiment of a cooling device 600. The cooling device 600 is similar to the cooling device 400 or 500 with the exception that the vibration transducer is configured to direct the agitation or vibration at a particular region/location 646 over the electronic device. The device 600 employs a liquid flow configuration to flow liquid across an electronic device 606 and an agitation device with directed agitation to cause turbulent in the liquid as it flows across the electronic device 606 at the particular region 646. As shown in FIG. 6, the cooling device 600 includes a housing 614 having an inlet 610 and an outlet 612. A vibration transducer 616 is coupled to the housing 614. The vibration transducer 616 is configured with a focus point 630 that is able to direct the vibration to the region 646. Alternatively, the vibration transducer 616 may be moved laterally over a particular region to accomplish directed vibration. A coolant liquid is flown into the housing 614 from the inlet 610 and exits the housing 614 via the outlet 612. The housing 614 includes an interior portion 615 where the electronic device 606 can reside. In one embodiment, the housing 614 is made of a rigid material such as plastic, ceramic, or other insulated rigid material. In one embodiment, the vibration transducer 616 is placed on the top surface area of the housing 614. The housing 614 can be configured to have an opening created for the vibration transducer 616 to be placed therethrough. The housing 614 is placed over the electronic device 606 and is sealed over the electronic device 606 to prevent leakages from the housing 614 into surrounding area. Coolant liquid is flown across the electronic device 606 to dissipate heat generated by the electronic device 606. As the coolant liquid is flown across the electronic device 606, the vibration transducer 616 is turned on to cause a directed turbulent or agitation 646 in the liquid flow system. The electronic device 606 is also placed on a substrate 604 which may be placed on a printed circuit board 602 or other component of a computer system. In one embodiment, the housing 614 is a manifold placed over the electronic device 606 using gaskets 608 to couple and seal the housing 614 over the electronic device 606 or a particular region of the electronic device 606.

Figure 7:
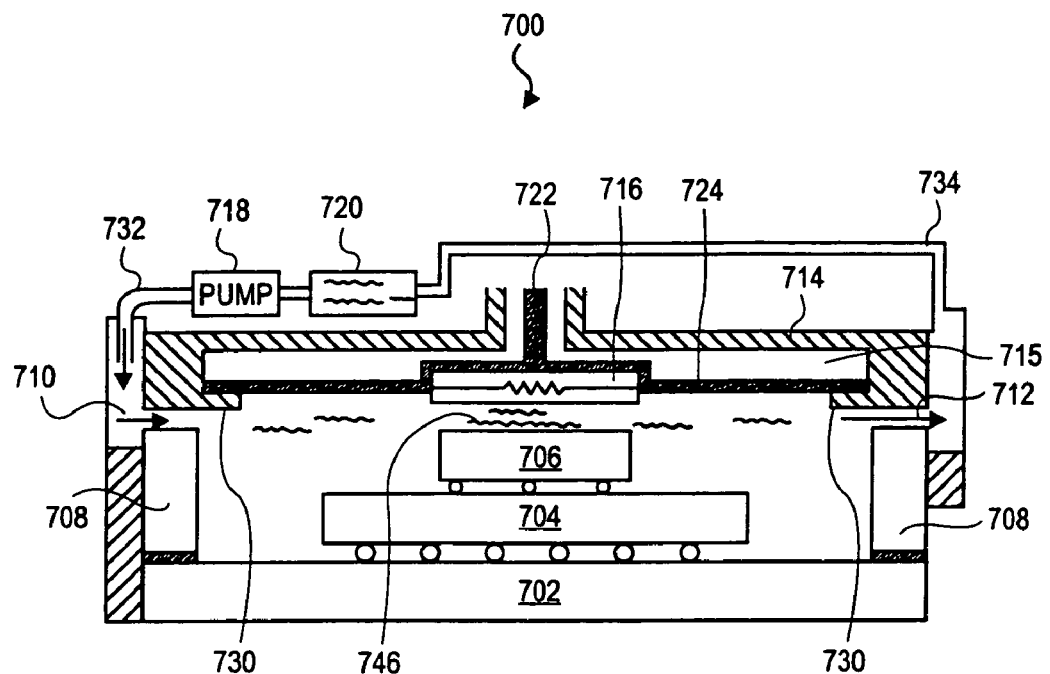
FIG. 7 illustrates another exemplary cooling system in accordance to exemplary embodiments of the present invention.
Figure 8:
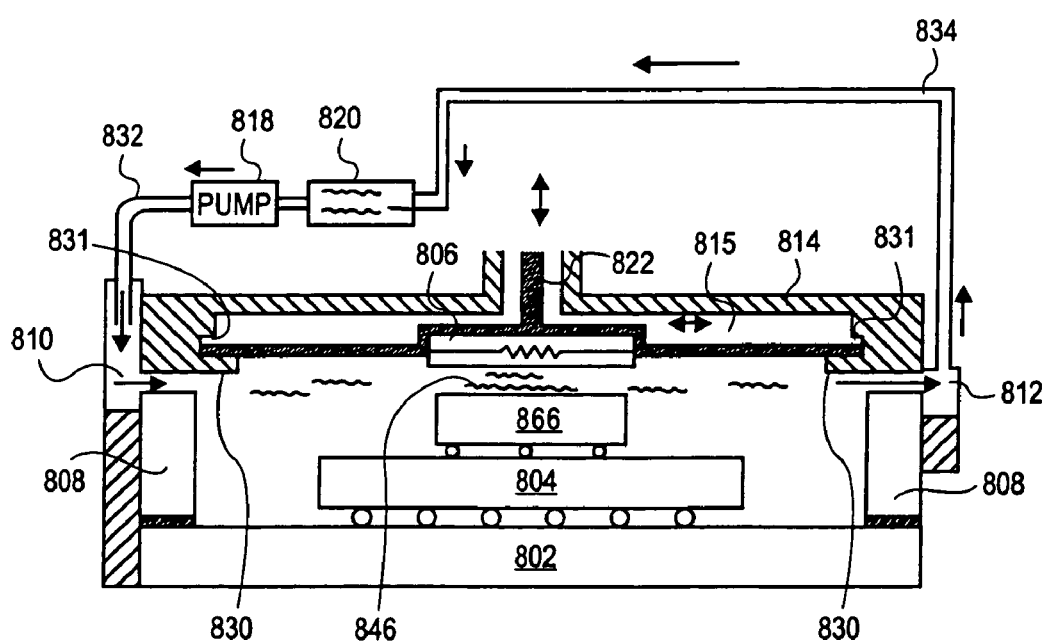
FIG. 8 illustrates another exemplary cooling system in accordance to exemplary embodiments of the present invention.

FIG. 7 illustrates an exemplary cooling device 700, which includes a fluid recycling system. The cooling system 700 is similar to the cooling systems 400, 500, or 600 previously described with the addition of the fluid paths. Similar to above, the cooling system 700 includes a housing 714 with an inlet 710, an outlet 712 and a vibration transducer 716. The housing 714 includes an interior portion 715 within which an electronic device 706 can be placed. The electronic device 706 can be coupled to a substrate 704 which can also be coupled to a printed circuit board 702 or other surface. The housing 714 is placed over the electronic device 706 and sealed over the electronic device 706 using gaskets 708.

In the cooling device 700, a fluid path 732 which leads to the inlet 710 and a fluid path 734 which leads from the outlet 712 are included. The coolant liquid is flown into the housing 714 through the fluid path 732 and the inlet 710. The coolant liquid exits the housing 714 through the outlet 712 and the fluid path 734. The cooling device 700 further includes a reservoir 720 which supplies the coolant liquid and a pump 718 placed in fluid communication between the reservoir 720 and the inlet 710. In the present embodiment, the fluid path 732 can be a tube or conduit leading from the reservoir, through the pump and into the inlet 710 to bring the coolant liquid into the housing 714. Additionally, the fluid path 734 can also be a tube or a conduit leading form the outlet 712 into the reservoir 720. The coolant liquid thus can be recycled through the action of the pump 718. The pump 718 can be a conventional miniature pump capable of pumping the liquid into the cooling device 700. The pump 718 can also be a piezoelectric pump known in the art.

The cooling device 700 also includes a handle or an actuator 722 disposed within the housing 714. The vibration transducer 716 is coupled to the handle 722. In one embodiment, the handle 722 is configured to be able to move vertically up and down so as to give the vibration transducer 716 vertical adjustability. In the present embodiment, the handle 722 includes a stand off feature 730 to define the lowest vertical movement point of the vibration transducer 716. The stand off feature 730 defines the minimal distance between the electronic device 706 and the vibration transducer 722. Once the vibration transducer 716 is set at the desired position, the handle 722 can be fixed or locked in place.

In another embodiment, a cooling device 800, which is similar to the device 700, includes a handle 822 similar to the handle 722 with the addition of a lateral adjustability. The cooling device 800 is similar to the device 700 except that the housing can be configured so that the handle 800 can be moved laterally to place the vibration transducer over a particular region of the electronic device. Similar to above, the cooling system 800 includes a housing 814 with an inlet 810, an outlet 812 and a vibration transducer 816. The housing 814 includes an interior portion 815 within which an electronic device 806 can be placed. The electronic device 806 can be coupled to a substrate 804 which can also be coupled to a printed circuit board 802 or other surface. The housing 814 is placed over the electronic device 806 and sealed over the electronic device 806 using gaskets 808.

In the cooling device 800, a fluid path 832 which leads to the inlet 810 and a fluid path 834 which leads from the outlet 712 are included. The coolant liquid is flown into the housing 814 through the fluid path 832 and the inlet 810. The coolant liquid exits the housing 814 through the outlet 812 and the fluid path 834. The cooling device 800 further includes a reservoir 720 which supplies the coolant liquid and a pump 818 placed in fluid communication between the reservoir 820 and the inlet 810. In the present embodiment, the fluid path 832 can be a tube or conduit leading from the reservoir, through the pump and into the inlet 810 to bring the coolant liquid into the housing 814. Additionally, the fluid path 834 can also be a tube or a conduit leading form the outlet 812 into the reservoir 820. The coolant liquid thus can be recycled through the action of the pump 818.

The cooling device 800 also includes a handle or an actuator 822 disposed within the housing 814. The vibration transducer 816 is coupled to the handle 822. In one embodiment, the handle 822 is configured to be able to move vertically up and down so as to give the vibration transducer 816 vertical adjustability. In the present embodiment, the handle 822 includes a stand off feature 830 to define the lowest vertical movement point of the vibration transducer 816. The stand off feature 830 defines the minimal distance between the electronic device 806 and the vibration transducer 822. Additionally, the housing 814 can include slots 831 so that the handle 822 can be withdrawn partially into the slots 831 a position the vibration transducer 806 over a particular region of the electronic device 806. Once the vibration transducer 816 is set at the desired position, the handle 822 can be fixed or locked in place.

The vibration transducers of the exemplary embodiments can be excited at its resonance frequency (or multiple thereof) so that their power consumption can be very low (and the energy it imparts on the liquid may in turn be low). This way, the power source to supply power to the cooling system needs not be a new device to be implemented into a computer system and can be drawn from already existing power source. Additionally, because of the addition of the vibration or agitation, the cooling devices of the embodiments of the present invention can operate under low pressure.

The coolant liquid that can be used for the cooling devices include water and fluorocarbon liquids such as fluorinert liquid (FC-77) manufactured by 3M Company. Other suitable coolant liquid can also be used. Instead of a liquid, the fluid can be a gas such as air. An inert gas can be used for this purpose.

Figure 9:
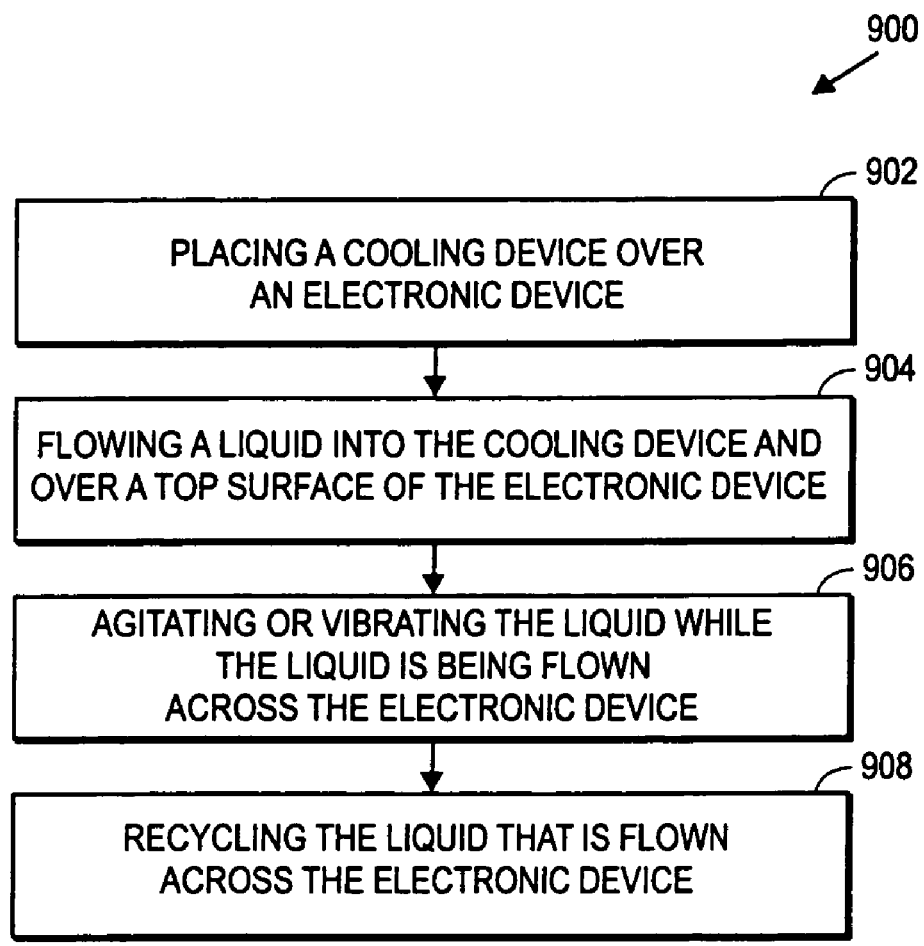
FIG. 9 illustrates an exemplary embodiment of a method of cooling of an electronic device using a cross flow system in combination with a vibration transducer.

FIG. 9 illustrates an exemplary method of cooling an electronic device. At box 902, a cooling device is placed over the electronic device. The cooling device can be anyone of the exemplary cooling devices previously described. At box 904, a liquid is flown (e.g., laterally) into the cooling device and over the top surface of the electronic device. The liquid is water in one embodiment. In one embodiment, the liquid is pumped into the cooling device through the action of a pump. At box 906, the liquid is agitated or vibrated while the liquid is flowing across the electronic device. Such agitation or vibration in the liquid prevents stagnation of the liquid over the electronic device, especially at the area immediately above the electronic device. Such agitation or vibration increases efficiency of the heat transfer from the electronic device to cool the electronic device. The cooling device can be a cross flow cooling device where a vibration transducer is incorporated into the cooling device to agitate the fluid that is used to cool the electronic device. The vibration or agitation is accomplished by using a vibration transducer or an ultrasonic transducer or vibrator. In one embodiment, the ultrasonic transducer is a piezoelectric transducer. The ultrasonic transducer is placed above the electronic device at a predetermined distance, e.g., at about 1 mm to about 30 mm above the electronic device. In one embodiment, the ultrasonic transducer is placed substantially immediately above the electronic device. At box 908, the liquid that is flown across the electronic device is recycled, for example, through the action of a pump connected to or coupled to the cooling device. In one embodiment, the ultrasonic transducer directs the vibration or agitation at a particular region over the electronic device. Such directed vibration helps eliminating hot spots of the electronic device. The electronic device can be any one of an integrated circuit, a semiconductor device, a central processing unit, a controller, a graphic controller, a memory chip, a display element, a hard disk drive, a battery, a printer circuit board, and an optical disk drive.

In one embodiment, a cooling device in accordance to embodiments of the present invention is incorporated into a notebook computer. The notebook computer comprises a main logic board that has a plurality of interconnection contacts (e.g., solder ball or pin connections) placed thereon. An integrated circuit chip (e.g., a graphic controller chip or a CPU) is coupled to the main logic board as is known in the art. The IC chip makes electrical and mechanical interconnection to the main logic board through conventional interconnection contacts. In one embodiment, the IC chip has a ball-grid-array packaging format that makes interconnection to the main logic board via a plurality of solder balls, lead wires, or other suitable electrical interconnections for high density circuit. A cooling device such as the cooling device 400, 500, 600, 700, or 800 is placed over to the IC chip. The IC chip can be the electronic device 406, 506, 606, 706, or 806 previously shown. It is to be noted that the notebook computer may comprise other internal electrical devices or components as is well known in the art. After all the internal components of the notebook computer are assembled, an enclosure case is placed over all of the internal components including the cooling device.

The notebook computer also includes a display apparatus, e.g., a flat panel display, coupled to the enclosure case. In one embodiment, the display apparatus is controlled at least in part by a graphic controller chip. The graphic controller chip can be the IC chip that is coupled to the cooling device.

It is to be understood that the cooling devices in accordance to embodiments of the present invention can be adapted for other electronic components and other computer system besides a notebook like computer system. The cooling devices can be configured (shape, size, thickness, etc . . . ) to be placed over a surface of an internal electronic component (e.g., a central processing unit or a circuit board) of a particular machine or a particular computer system such as a desk top computer. A few examples of other electronic devices that can benefit from the cooling devices include a Personal Digital Assistant (PDA), a cellular phone, and a monitor display.

The exemplary embodiments described herein are provided merely to illustrate the principles of the invention and should not be construed as limiting the scope of the subject matter of the terms of the claimed invention. The specification and drawings are, accordingly, to be regarded in an illustrative rather than a restrictive sense. Moreover, the principles of the invention may be applied to achieve the advantages described herein and to achieve other advantages or to satisfy other objectives, as well.

We claim:

1. A semiconductor device with a cooling system comprising:
   an integrated circuit bonded to a substrate;
   a housing coupled over the integrated circuit;
   an inlet provided in the housing;
   an outlet provided in the housing; and
   a vibration transducer coupled to the housing and placed above the integrated circuit;
   wherein a liquid is flown across the integrated circuit from the inlet and exit through the outlet to cool the integrated circuit.

2. The semiconductor device of claim 1 further comprising:
   a fluid path coupling to the housing, the liquid to flow into the housing through the fluid path and out of the housing through the fluid path.

3. The semiconductor device of claim 1 wherein the vibration transducer causes turbulent or agitation in the liquid flown across the integrated circuit.

4. The semiconductor device of claim 1 wherein the vibration transducer includes a piezoelectric transducer.

5. The semiconductor device of claim 1 wherein the vibration transducer causing a vibration the a non-audible range.

6. The semiconductor device of claim 1 wherein the vibration transducer causes a vibration in an ultrasonic range.

7. The semiconductor device of claim 1 wherein the vibration transducer is configured to direct vibration to a particular position over the integrated circuit.

8. The semiconductor device of claim 1 wherein the vibration transducer is coupled to the housing with a vertical adjustability above the integrated circuit.

9. The semiconductor device of claim 1 wherein the vibration transducer is coupled to the housing with a lateral adjustability.

10. The semiconductor device of claim 1 wherein the housing further includes a handle where the vibration transducer is coupled to and wherein the handle is moveable in a vertical position and lateral position to provide the vibration transducer with one or both of lateral adjustability and vertical adjustability over the integrated circuit.

11. The semiconductor device of claim 1 further comprises a pump placed in proximity to the housing, the pump to cause the liquid to flow into the inlet and out of the outlet and across the integrated circuit.

12. The semiconductor device of claim 1 further comprises a liquid reservoir placed in proximity to the housing, the liquid reservoir to supply the liquid to the housing.

13. The semiconductor device of claim 1 wherein the substrate is bonded to a printed circuit board.

14. A cooling system comprising:
a housing having an inlet and an outlet, a liquid to be flown from the inlet into the housing and out of outlet to exit the housing, the housing further having an interior portion for an electronic device to reside therein; and
a vibration transducer coupled to the housing;
wherein the liquid is flown across the electronic device to dissipate heat from the electronic device; and
wherein the vibration transducer causes turbulent or agitation in the liquid as the liquid is flown across the electronic device.

15. The cooling system of claim 1 wherein the vibration transducer is postioned above the electronic device at a predetermined distance.

16. The cooling system of claim 15 wherein the predetermined distance ranges from about 1 mm to about 30 mm.

17. The cooling system of claim 16 wherein the vibration transducer is configured to direct vibration over a particular region of the electronic device.

18. The cooling system of claim 14 further comprising:
a first fluid path leading from a liquid reservoir coupling to the inlet of the housing and a second fluid path extending from the outlet of the housing, wherein the liquid is flown into the housing through the first fluid path and exit out of the housing through the second fluid path.

19. The cooling system of claim 18 wherein the second fluid path recycles the liquid back into the liquid reservoir.

20. The cooling system of claim 19 further comprises a pump placed between the reservoir and the inlet.

21. The cooling system of claim 14 wherein the vibration transducer causes turbulent or agitation in the liquid flown across the electronic device.

22. The cooling system of claim 14 wherein the vibration transducer includes a piezoelectric transducer.

23. The cooling system of claim 14 wherein the vibration transducer causing a vibration a non-audible range.

24. The cooling system of claim 14 wherein the vibration transducer causes a vibration in an ultrasonic range.

25. The cooling system of claim 14 wherein the vibration transducer is configured to direct vibration to a particular position over the electronic device.

26. The cooling system of claim 14 wherein the vibration transducer is coupled to the housing with a vertical adjustability.

27. The cooling system of claim 14 wherein the vibration transducer is coupled to the housing with a lateral adjustability.

28. The cooling system of claim 14 wherein the housing further includes an actuator where the vibration transducer is coupled to and wherein the actuator is moveable in a vertical position and lateral position to provide the vibration transducer with one or both of lateral adjustability and vertical adjustability.

29. The cooling system of claim 14 further comprises a liquid reservoir placed in proximity to the housing, the liquid reservoir to supply the liquid to the housing.

30. A method of cooling an electronic device comprising:
placing a cooling device over the electronic device;
flowing a liquid into the cooling device and over the top surface of the electronic device; and
agitating the liquid flow while the liquid is flowing across the electronic device, agitating the liquid prevents stagnation of the liquid over the electronic device.

31. The method of claim 30 further comprises recycling the liquid.

32. The method of claim 30 wherein the cooling device is a cross flow cooling device.

33. The method of claim 30 wherein agitating the liquid further comprise using an ultrasonic vibrator placed within the cooling device and above the electronic device.

34. The method of claim 30 wherein agitating the liquid further comprise using a piezoelectric transducer placed within the cooling device and above the electronic device.

35. The method of claim 30 further comprises pumping the liquid into the cooling device to flow the liquid across the electronic device.

36. The method of claim 35 further comprises agitating the liquid using an ultrasonic vibrator placed within the cooling device and above the electronic device.

37. The method of claim 35 further comprises agitating the liquid using a piezoelectric transducer placed within the cooling device and above the electronic device.

38. The method of claim 30 wherein the liquid includes water.

39. The method of claim 30 wherein agitating the liquid includes using an ultrasonic vibrator placed substantially immediately above the electronic device and over the liquid that is flown across the electronic device.

40. The method of claim 30 wherein agitating the liquid includes using an ultrasonic vibrator placed at a distance ranges from about 1 mm to about 30 mm above the electronic device and over the liquid that is flown across the electronic device.

41. The method of claim 30 wherein agitating the liquid includes using an ultrasonic vibrator to direct a turbulent at a particular region over the electronic device.

42. The method of claim 41 wherein the particular region over the electronic device tends to be a hot spot region of the electronic device.

43. The method of claim 30 wherein the electronic device is any one of an integrated circuit, a semiconductor device, a central processing unit, a controller, a graphic controller, a memory chip, a display element, a hard disk drive, a battery, a printer circuit board, and an optical disk drive.

44. A computer system comprising:
an electronic device disposed within an enclosure case;
a cooling device placed over a surface of the electronic device of the computer system, the cooling device further comprises a housing having an inlet and an outlet, a liquid to be flown from the inlet into the housing and out of outlet to exit the housing, the housing further having an interior portion for an electronic device to reside therein, and a vibration transducer coupled to the housing, wherein the liquid is flown across the electronic device to dissipate heat from the electronic device and wherein the vibration transducer causes turbulent or agitation in the liquid as the liquid is flown across the electronic device.

45. The computer system of claim 44 wherein the electronic device is any one of an integrated circuit, a semiconductor device, a central processing unit, a controller, a graphic controller, a memory chip, a display element, a hard disk drive, a battery, a printer circuit board, and an optical disk drive.

46. The computer system of claim 44 further comprises a display apparatus coupled to the enclosure case and controlled at least in part by the graphic controller chip.

47. The computer system of claim 44 wherein the computer system is a notebook computer.

48. The computer system of claim 44 wherein the vibration transducer causes turbulent or agitation in the liquid flown across the electronic device.

49. The computer system of claim 44 wherein the vibration transducer includes a piezoelectric transducer.

50. The computer system of claim 44 wherein the vibration transducer causing a vibration a non-audible range.

51. The computer system of claim 44 wherein the vibration transducer causes a vibration in an ultrasonic range.

52. The computer system of claim 44 wherein the vibration transducer is configured to direct vibration to a particular position over the electronic device.

53. The computer system of claim 44 wherein the vibration transducer is coupled to the housing with a vertical adjustability.

54. The computer system of claim 44 wherein the vibration transducer is coupled to the housing with a lateral adjustability.

55. A semiconductor device with a cooling system comprising:
   an integrated circuit bonded to a substrate;
   a housing coupled over the integrated circuit;
   an inlet provided in the housing;
   an outlet provided in the housing; and
   a vibration transducer coupled to the housing and placed above the integrated circuit;
   wherein a fluid is flown across the integrated circuit from the inlet and exit through the outlet to cool the integrated circuit.

56. The semiconductor device of claim 55 wherein the fluid is a gas.

57. The semiconductor device of claim 55 wherein the vibration transducer causing a vibration the a non-audible range.

58. The semiconductor device of claim 55 wherein the vibration transducer causes a vibration in an ultrasonic range.

59. The semiconductor device of claim 55 wherein the vibration transducer is configured to direct vibration to a particular position over the integrated circuit.

60. The semiconductor device of claim 55 wherein the vibration transducer is coupled to the housing with a vertical adjustability above the integrated circuit.

61. The semiconductor device of claim 55 wherein the vibration transducer is coupled to the housing with a lateral adjustability.

62. A cooling system comprising:
   a housing having an inlet and an outlet, a fluid to be flown from the inlet into the housing and out of outlet to exit the housing, the housing further having an interior portion for an electronic device to reside therein; and
   a vibration transducer coupled to the housing;
   wherein the fluid is flown across the electronic device to dissipate heat from the electronic device; and
   wherein the vibration transducer causes turbulent or agitation in the fluid as the fluid is flown across the electronic device.

63. The cooling system of claim 62 wherein the fluid is a gas.

64. The cooling system of claim 62 wherein the vibration transducer causing a vibration the a non-audible range.

65. The cooling system of claim 62 wherein the vibration transducer causes a vibration in an ultrasonic range.

66. The cooling system of claim 62 wherein the vibration transducer is configured to direct vibration to a particular position over the integrated circuit.

67. The cooling system of claim 62 wherein the vibration transducer is coupled to the housing with a vertical adjustability above the integrated circuit.

68. The cooling system of claim 62 wherein the vibration transducer is coupled to the housing with a lateral adjustability.

69. A computer system comprising:
   an electronic device disposed within an enclosure case;
   a cooling device placed over a surface of the electronic device of the computer system, the cooling device further comprises a housing having an inlet and an outlet, a fluid to be flown from the inlet into the housing and out of outlet to exit the housing, the housing further having an interior portion for an electronic device to reside therein, and a vibration transducer coupled to the housing, wherein the liquid is flown across the electronic device to dissipate heat from the electronic device and wherein the vibration transducer causes turbulent or agitation in the fluid as the fluid is flown across the electronic device.

* * * * *